(12) United States Patent
Chen et al.

(10) Patent No.: US 6,933,157 B2
(45) Date of Patent: Aug. 23, 2005

(54) SEMICONDUCTOR WAFER MANUFACTURING METHODS EMPLOYING CLEANING DELAY PERIOD

(75) Inventors: Chia-Lin Chen, Hsin-Chu (TW); Tze-Liang Lee, Hsin-Chu (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/712,460

(22) Filed: Nov. 13, 2003

(65) Prior Publication Data

US 2005/0106863 A1 May 19, 2005

(51) Int. Cl.⁷ .............................................. H01L 21/00
(52) U.S. Cl. .......................................... 438/5; 438/906
(58) Field of Search .............................. 438/906, 7, 10, 438/5

(56) References Cited

U.S. PATENT DOCUMENTS

| | | | |
|---|---|---|---|
| 5,371,396 A | 12/1994 | Vinal et al. | |
| 5,521,127 A | 5/1996 | Hori et al. | |
| 5,704,986 A * | 1/1998 | Chen et al. | 134/26 |
| 5,710,450 A | 1/1998 | Chau et al. | |
| 5,840,125 A | 11/1998 | Gronet et al. | |
| 5,851,892 A * | 12/1998 | Lojek et al. | 438/305 |
| 5,943,230 A | 8/1999 | Rinnen et al. | |
| 5,959,333 A | 9/1999 | Gardner et al. | |
| 6,020,260 A | 2/2000 | Gardner | |
| 6,099,647 A | 8/2000 | Yich et al. | |
| 6,110,812 A | 8/2000 | Ho et al. | |
| 6,114,258 A | 9/2000 | Miner et al. | |
| 6,159,866 A | 12/2000 | Gronet et al. | |
| 6,207,304 B1 | 3/2001 | Law et al. | |
| 6,242,776 B1 | 6/2001 | Hause et al. | |
| 6,323,094 B1 | 11/2001 | Wu | |
| 6,326,664 B1 | 12/2001 | Chau et al. | |
| 6,399,445 B1 | 6/2002 | Hattangady et al. | |
| 6,402,850 B1 | 6/2002 | Beinglass et al. | |
| 6,410,090 B1 | 6/2002 | Wang | |
| 6,413,871 B2 | 7/2002 | M'Saad et al. | |
| 6,450,116 B1 | 9/2002 | Noble et al. | |
| 6,455,406 B1 | 9/2002 | Linderer et al. | |
| 6,482,726 B1 | 11/2002 | Aminpur et al. | |
| 6,488,776 B2 | 12/2002 | Wang | |
| 6,518,203 B2 | 2/2003 | Narwankar et al. | |
| 6,534,401 B2 | 3/2003 | Joo et al. | |
| 6,571,371 B1 * | 5/2003 | Coss et al. | 716/4 |
| 2002/0009900 A1 | 1/2002 | Tay et al. | |

OTHER PUBLICATIONS

Arnaud, F., et al., "Gate Oxide Process Impact on RNCE for Advanced CMOS Transistors", Sep. 2002, ESSDERC '02, Firenze Italy, 21 pages.

Li, Gene, "Total Solutions for Front-End Thermal Processing", Foresight, May 2001, pp. 41-45.

(Continued)

Primary Examiner—Caridad Everhart
(74) Attorney, Agent, or Firm—Haynes and Boone, LLP

(57) ABSTRACT

A method of manufacturing a semiconductor wafer including cleaning a surface of the wafer during a first time period and forming a layer over the surface during a second time period. The first time period includes a cleaning delay period prior to a cleaning portion of the first time period, the cleaning delay period configured such that an end time of the first time period substantially coincides with a start time of the second time period.

14 Claims, 2 Drawing Sheets

OTHER PUBLICATIONS

Zonca, R., et al., "Ultra Thin NO/N$_2$O Oxynitride Dielectric for Advanced Flash Memory Application: Single Wafer and Batch Technology", 6 pages.

"Gate Stack", World Wide Web http://www.appliedmaterials.com/products/gate_stack.html, printed on Feb. 17, 2003, 1 page.

"Technology Challenges for 100nn and Beyond Transistor and Capacitor Fabrication: Fig. 8", World Wide Web http://www.future-fab.com/assets/images/FFI11E1104F8.htm, printed on Feb. 18, 2003, 1 page.

Decoupled Plasma Nitridation (DPN), May 2001, Foresight, pp. 43-45.

* cited by examiner

SEMICONDUCTOR WAFER MANUFACTURING METHODS EMPLOYING CLEANING DELAY PERIOD

CROSS-REFERENCE

This invention relates to U.S. patent application Ser. No. 10/395,345, filed Mar. 24, 2003, entitled, "Device Performance Improvement by Heavily Doped Pre-Gate and Post Polysilicon Gate Clean" assigned to a common assignee.

BACKGROUND

The present invention relates generally to semiconductor processing and, more specifically, to methods of manufacturing semiconductor wafers employing one or more cleaning delay periods.

Scaling of complementary-metal-oxide-semiconductor (CMOS) technology is driven by the goals of increased integration density and improved performance. However, such scaling can be accompanied by increased penetration of impurities through-gate electrodes, especially as the dimensions of CMOS devices enter the deep-submicron regime. The performance of the scaled devices has also been hampered by excessive gate leakage current, resulting in exorbitant standby power consumption and rendering end-products commercially unacceptable.

Consequently, various nitridation methods have been proposed to replace at least portions of the silicon dioxide dielectric layers. For example, ultra-thin gate dielectric layers comprising stacked nitride and oxide layers have been proposed as viable alternatives to silicon dioxide. Such ultra-thin gate dielectric layers exhibit a high barrier to impurity diffusion and low gate leakage current density. Consequently, at least for deep-submicron CMOS devices and circuits, gate dielectric layers have been scaled towards configurations exhibiting a direct tunneling region. Many nitridation methods promise to further reduce leakage current levels and dielectric layer thicknesses while maintaining satisfactory effective oxide thicknesses far exceeding actual dielectric layer thicknesses.

Those skilled in the art recognize that semiconductor fabrication procedures typically include a large number of individual process steps, including numerous surface cleaning, material deposition, layer patterning and etching steps, often performed in a complex sequence resulting in the formation of 50–100 discrete layers and/or features. In view of the significant number of steps required to manufacture semiconductor devices, it is desirable to complete each step as quickly as possible without sacrificing manufacturing quality.

Accordingly, cluster tools configured to perform several consecutive process steps without transferring product wafers between separate process tools or workstations have played an integral role in the acceleration of semiconductor device fabrication schedules. For example, a first substrate having a surface previously cleaned in a cleaning chamber of a cluster tool may undergo oxidation in an oxide growth chamber while a second substrate is simultaneously cleaned in the cleaning chamber. However, the processes performed in each of the chambers of a cluster tool may not require the same amount of time for execution.

For example, continuing with the example above, the cleaning process may require only a fraction of the time required by the oxidation process. Consequently, the second substrate may be cleaned and ready for placement in the oxide growth chamber when the oxidation of the first substrate is only partially completed. However, as a result of the cleaning process, the second substrate may begin to oxidize within the cleaning chamber while the oxide growth chamber remains occupied by the first substrate. As a result, a thin layer of oxide may unintentionally form on the second substrate prior to the desired oxidation of the second substrate in the oxide growth chamber. Accordingly, the differences in the duration of individual process steps can render achieving a desired thickness and/or other electrical characteristic of a gate dielectric layer difficult, if not impossible.

Accordingly, what is needed in the art is a method of manufacturing a semiconductor device layer that addresses the above-discussed issues.

SUMMARY

The present disclosure provides a method of manufacturing a semiconductor wafer including cleaning a surface of the wafer during a first time period and forming a layer over the surface during a second time period. The first time period includes a cleaning delay period configured such that an end time of the first time period substantially coincides with a start time of the second time period.

A method of manufacturing semiconductor device gate dielectrics is also introduced in the present disclosure. In one embodiment, the method includes cleaning a first substrate surface during a first time period and forming a first insulating layer over the first substrate surface during a second time period subsequent to the first time period. A second substrate surface is cleaned during a third time period and a second insulating layer is formed over the second substrate surface during a fourth time period subsequent to the second and third time periods. The third time period includes a cleaning delay period configured such that an end time of the third time period substantially coincides with a start time of the fourth time period.

The present disclosure also provides a system for manufacturing semiconductor device gate dielectrics including, in one embodiment, a cleaner configured to clean a surface of a substrate within a first time period, a former configured to form a layer over the surface within a first time interval exceeding the first time period in duration, and a transporter configured to transport the substrate between the cleaner and the former within a second time period. The system also includes a controller configured to control the cleaner, the former and the transporter. The controller is also configured to delay a start time of the first time period such that a duration of a third time period temporally concatenating the first and second time periods is less than the first time interval.

The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

The present invention is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings.

DETAILED DESCRIPTION

Figure 1:
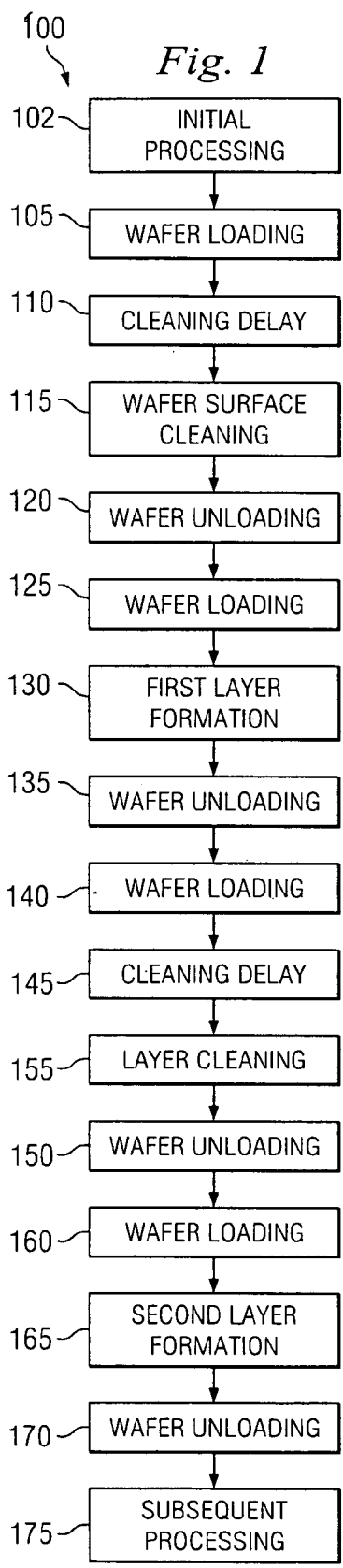
FIG. 1 illustrates a flow chart of one embodiment of a method of manufacturing a semiconductor wafer according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a flow chart of one embodiment of a method 100 of manufacturing a semiconductor wafer according to aspects of the present disclosure. The method 100 may include initial processing 102, such as preparing a wafer or substrate for processing by slicing or otherwise removing a portion of a silicon ingot, or conventionally preparing a silicon-on-insulator substrate, and planarizing the resulting substrate, such as by chemical-mechanical polishing, and/or other processes.

The method 100 continues during a wafer loading period 105 in which the substrate may be oriented or otherwise loaded into a cleaning process tool. The orientation performed during the wafer loading period 105 contemplates orienting the substrate in a stand-alone cleaning process tool. However, in a preferred embodiment, the wafer loading period 105 encompasses loading the substrate into a cleaning chamber of a single-wafer-processing cluster tool, such as the Oasis Clean system manufactured by Applied Materials, Inc. of Santa Clara, Calif. For example, a substrate may be loaded into the cluster tool through a load-lock chamber and transported from the load-lock chamber to a cleaning chamber by hand- and/or robotic-operation and oriented within the cleaning chamber according to chamber-specific operational requirements.

Once oriented in the cleaning chamber or other cleaning process tool, the substrate may remain unprocessed during a cleaning delay period 110. The cleaning delay period 110 is configured such that the substrate may undergo subsequent processing as soon as possible after a cleaning process is completed. For example, as described above, delay between cleaning and oxidation steps in conventional manufacturing methods can prevent precise control of oxide growth. However, by configuring the cleaning delay period 110 such that the delay between the end of a subsequent cleaning process and the start of an oxidation process is minimized, the thickness of oxide growth may be more precisely controlled, because a larger percentage of the resulting oxide layer is grown in a controlled growth environment in contrast to the environment of the cleaning chamber or a cluster tool common area.

A cleaning period 115 commences after the cleaning delay period 110. The cleaning period 115 may include one or more conventional or future-developed cleaning procedures, including those in which a wafer may be submersed in a cleaning solution or a surface of the wafer may be otherwise rinsed with a cleaning solution. The cleaning solution may comprise deionized water or another process chemistry suited to cleaning contaminants and other debris from the surface of the wafer. In one embodiment, the cleaning solution may comprise ammonia hydroxide or conventional SC1 or SC2 wet bench chemistries. In a preferred embodiment, the cleaning solution comprises AM1, a proprietary chemical solution created by Applied Materials or Santa Clara, Calif., for use with the Oasis Clean system described above. The cleaning period 115 may have a duration of about 30 seconds, although the duration of the cleaning period 115 is not limited by the present disclosure. After being cleaned, the substrate or wafer may be removed from the cleaning tool by hand- and/or robotic-operation during a wafer unloading period 120.

Thus, the cleaning process of the present disclosure may include periods 105–120. Moreover, the cleaning process may be configured to have an end time that is substantially coincident with a start time of a subsequent process, at least partially due to the adjustable duration of the cleaning delay period 110. That is, by adjusting, selecting or predetermining the duration of the cleaning delay period 110, a cleaning process incorporating the cleaning delay period 110 may include a corresponding degree of customization. Of course, cleaning processes according to aspects of the present disclosure need not include each of the periods 105–120 described above. For example, one embodiment of a cleaning process within the scope of the present disclosure may include only the cleaning delay period 110 and the cleaning period 115. In addition, cleaning processes within the scope of the present disclosure may also include one or more of the periods 105–120 in sequences other than described above and wherein the cleaning delay period 110 occurs before the cleaning period 115. For example, the cleaning delay period 110 may be performed prior to the wafer loading period 105.

As shown in FIG. 1, the method 100 of manufacturing a semiconductor wafer may include processes in addition to the cleaning process described above. For example an oxidation process may begin soon or immediately after the conclusion of the cleaning process during a wafer loading period 125. As discussed above, delay between the end time of the cleaning process and the start time of the oxidation or other post-cleaning process is preferably minimized. In one embodiment, the delay is substantially eliminated by configuring the duration of the cleaning delay period 110 such that the end time of the cleaning process and the start time of the post-cleaning process are substantially coincident. In general, the delay between the cleaning process and the oxidation or other post-cleaning process may be less than about 30 seconds.

The wafer loading period 125 may be substantially similar to the wafer loading period 105 discussed above. However, the wafer loading period 125 also contemplates orienting or otherwise loading the substrate or wafer into an oxide growth process tool, which may be a stand-alone oxide growth process tool or a process chamber of a cluster tool. For example, the wafer loading period 125 may include loading and/or orienting the substrate in a DPN Centura 200 or DPN Centura 300 process tool, manufactured by Applied Materials, Inc. of Santa Clara, Calif. In one embodiment, the wafer unloading period 120 of the cleaning process and the wafer loading period 125 of the oxidation or other post-cleaning process may be combined into a single period. Moreover, the unloading and loading performed during the wafer unloading and loading periods 120, 125 may be performed by a single or common hand- or robotic-operated device.

After being loaded in the post-cleaning process tool, a first layer may be formed over the wafer in a first layer formation period 130. The first layer may have a thickness ranging between about 10 Angstroms and about 20 Angstroms. In a preferred embodiment, the first layer formation period 130 may include the formation of a gate dielectric layer. For example, an in-situ moisture generation process may be performed during the first layer formation period 130. The moisture generation process may include rapid thermal oxidation (RTO) or rapid thermal oxy-nitridation (RTNO). During these processes, a gas mixture comprising $H_2$, $NH_3$ or another hydrogen containing gas and $O_2$, $N_2O$ or another oxygen containing gas may be introduced into the process chamber. The oxygen containing gas may also include nitrogen for RTNO processes. The first layer formation process 130 may also include ramping the temperature of the process chamber at a relatively high rate until a dwell temperature is attained. The temperature ramp, dwell time and a subsequent cool down period may cumulatively span an interval ranging between about 30 seconds and about 5 minutes. Of course, other post-cleaning processes and process parameters may be employed within the scope of the present disclosure.

For example, the first layer formation process 130 may also include an in-situ or ex-situ plasma nitridation process, possibly following the oxidation process that occurs during the moisture generation process described above, thereby incorporating nitrogen into the substrate or the oxide layer formed thereon. In a preferred embodiment, the nitridation process is a decoupled plasma nitridation (DPN) having a plasma composition substantially comprising free radicals excited by a radio frequency (RF) source and wherein bombardment energy may be controlled by an RF or DC bias to the substrate. The first layer formation period 130 may also include a post-nitridation anneal, possibly in an environment comprising nitrogen and/or a nitrogen-containing gas, as well as one or more additional oxidation processes performed after the anneal. After the first layer is formed, the substrate or wafer may be removed from the oxide growth or other post-cleaning tool by hand- and/or robotic-operation during a wafer unloading period 135.

A second cleaning process may be performed after the first layer is formed. The second cleaning process may be substantially similar to the first cleaning process. For example, the second cleaning process may include a wafer loading period 140, a cleaning delay period 145, and a wafer unloading period 150 which may be substantially similar to the wafer loading period 105, the cleaning delay period 110 and the wafer unloading period 120 described above, respectively. The second cleaning process may also include a layer cleaning period 155 which may be substantially similar to the wafer cleaning period 115 described above, although the layer or layers formed during the first layer formation period 130 may be cleaned in the layer cleaning period 155 in contrast to or in addition to the substrate.

After the first layer has been formed and optionally cleaned, a second layer may be formed over the first layer. The second layer may have a thickness ranging between about 10 Angstroms and about 20 Angstroms. In embodiments in which the second cleaning process is performed, delay between the end time of the second cleaning process and the start time of the second layer formation may be minimized. Preferably, the delay is substantially eliminated by configuring the duration of the cleaning delay period 145 such that an end time of the second cleaning process and a start time of the second layer formation process are substantially coincident. In general, the delay between the second cleaning process and a subsequent process may be less than about 30 seconds.

The second layer formation process may include a wafer loading period 160 which may be substantially similar to the wafer loading period 105 discussed above. However, the wafer loading period 160 also contemplates orienting or otherwise loading the substrate or wafer in/on a polysilicon formation process tool, which may be a stand-alone process tool or a process chamber of a cluster tool. For example, the wafer loading period 160 may include loading and/or orienting the substrate in a DPN Centura 200 process tool, as described above. In one embodiment, the wafer unloading period 150 of the second cleaning process and the wafer loading period 160 of the polysilicon formation or other post-cleaning process may be combined into a single period. Moreover, the unloading and loading performed during the wafer unloading and loading periods 150, 160 may be performed by a common hand- or robotic-operated device.

After being loaded in the post-cleaning process tool, a second layer may be formed over the first layer in a second layer formation period 165. In a preferred embodiment, the second layer formation period 165 may include the formation of a gate electrode layer. For example, a doped or un-doped polysilicon or silicon or other conductive material formation process may be performed during the second layer formation period 165. In one embodiment, the POLYgen process created by Applied Materials, Inc. of Santa Clara, Calif., may be performed during the second layer formation period 165. After the second layer is formed, the substrate or wafer may be removed from the process tool by hand- and/or robotic-operation during a wafer unloading period 170.

Other processes may be employed within the scope of the present disclosure during the first and second layer formation periods 130, 165. Moreover, the first and second layers described above may be formed in-situ within a single process chamber or tool, as known in the art. The method 100 may also include a subsequent processing period 175 during which additional conventional or future-developed processing may be performed, such as to complete semiconductor transistor devices having gate stacks defined from the first and second layers described above.

Figure 2:
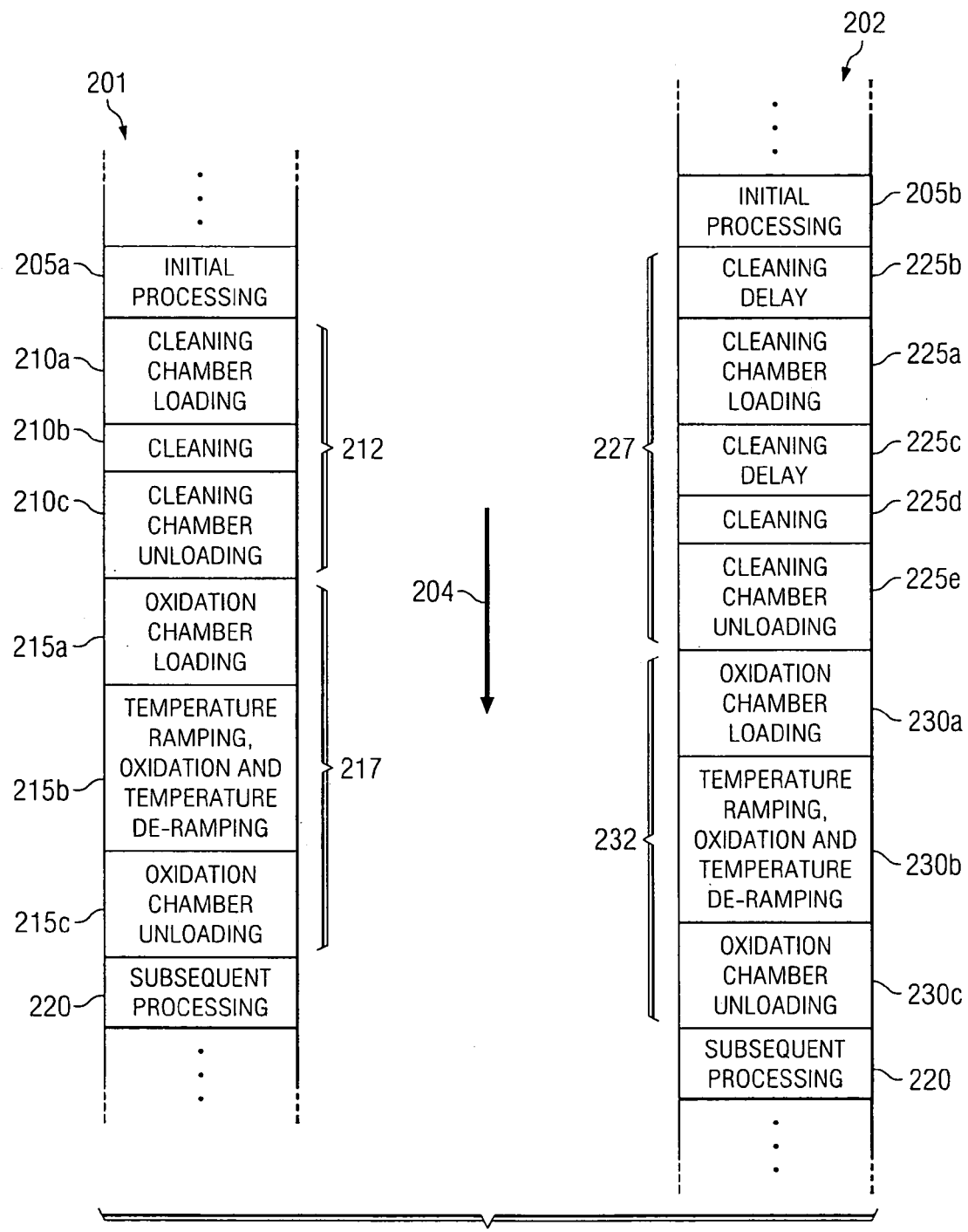
FIG. 2 illustrates a schematic view of one embodiment of a method of manufacturing semiconductor device gate dielectric layers according to aspects of the present disclosure.

Referring to FIG. 2, illustrated is a schematic view of one embodiment of a method 200 of manufacturing semiconductor device gate dielectric layers according to aspects of the present disclosure. The method 200 is one environment in which at least a portion of the method 100 of FIG. 1 may be implemented. However, the method 100 of FIG. 1 is presented in the context of processing a single semiconductor substrate or wafer, whereas the method 200 is presented in the context of processing multiple wafers in a substantially serial fashion. Nonetheless, aspects of the present disclosure, including those described in reference to the method 100 of FIG. 1 and the method 200 of FIG. 2, are readily adaptable to processing single wafers and wafer batches along one or more concurrent process paths.

The illustrated embodiment of the method 200 depicts the substantially serial manufacture of two wafers and their temporal interrelation. More specifically, the method 200 may include the manufacture of a first gate dielectric layer over a first substrate according to a first process path 201 and a second gate dielectric layer over a second substrate according to a second process path 202, wherein each of the process paths 201, 202 may be simultaneously traversed according to a common time line 204. The resulting first and second gate dielectric layers may each have a thickness ranging between about 10 Angstroms and about 20 Angstroms.

The first process path 201 includes optional initial processing 205*a* and cleaning chamber loading 210*a*. The first process path 201 also includes cleaning 210*b* during which at least one surface of the first substrate is cleaned. After optional cleaning chamber unloading 210*c* and oxidation chamber loading 215*a*, oxidation 215*b* may be performed to form a first gate dielectric layer over a surface of the first substrate. The first process path 201 may also include oxidation chamber unloading 215*c* and subsequent processing 220.

Thus, the first process path 201 includes a first time period 212 encompassing the cleaning 210*b* and, in some embodiments, the cleaning chamber loading 210*a* and the cleaning chamber unloading 210*c*, and also includes a second time period 217 encompassing the oxidation 215*b* and, in some embodiments, the oxidation chamber loading 215*a* and the oxidation chamber unloading 215*c*. As shown in FIG. 2, the second time period 217 is subsequent to the first time period 212. As also shown in FIG. 2, the cleaning chamber loading 210*a*, the cleaning 210*b*, the cleaning chamber unloading 210*c*, the oxidation chamber loading 215*a* and the oxidation chamber unloading 215*c* may be substantially similar in duration. For example, each of these events may have a duration of about 30 seconds. Of course, these events may have other durations within the scope of the present disclosure, and each may have varying durations. Moreover, FIG. 2 also illustrates that the oxidation 215*b* may have a duration exceeding the duration of the cleaning 210*b*, among other events. For example, the oxidation 215*b* may have a duration ranging between about 30 seconds about 5 minutes. In the illustrated embodiment, the oxidation 215*b* has a duration of about 2 minutes.

The second process path 202 includes optional initial processing 205*b* having at least a portion that may coincide temporally with at least a portion of the optional initial processing 205*a*. The second process path 202 also includes cleaning chamber loading 225*a* and at least one of cleaning delay 225*b* before the cleaning chamber loading 225*a* and cleaning delay 225*c* after the cleaning chamber loading 225*a*. The second process path 202 also includes cleaning 225*d* during which at least one surface of the second substrate is cleaned. After optional cleaning chamber unloading 225*e* and oxidation chamber loading 230*a*, oxidation 230*b* may be performed to form a second gate dielectric layer over a surface of the second substrate. The second process path 202 may also include oxidation chamber unloading 230*c* and subsequent processing 220.

Thus, the second process path 202 includes a third time period 227 encompassing the cleaning 225*d* and, in some embodiments, the cleaning chamber loading 225*a*, the cleaning delay 225*b*, the cleaning delay 225*c* and the cleaning chamber unloading 210*e*. The second process path 202 also includes a fourth time period 232 encompassing the oxidation 230*b* and, in some embodiments, the oxidation chamber loading 230*a* and the oxidation chamber unloading 230*c*. As shown in FIG. 2, the fourth time period 232 is subsequent to the third time period 227. Moreover, the third and fourth time periods 227, 232 may be consecutive, such that an end time of the third time period 227 may coincide with a start time of the fourth time period 232.

As also shown in FIG. 2, the cleaning chamber loading 225*a*, the cleaning 225*d*, the cleaning chamber unloading 225*e*, the oxidation chamber loading 230*a* and the oxidation chamber unloading 230*c* may be substantially similar in duration, preferably having a duration similar to corresponding events in the first process path 201. Of course, these events may have other durations within the scope of the present disclosure, and each may have varying durations. Moreover, FIG. 2 also illustrates that the oxidation 230*b* may have a duration exceeding the duration of the cleaning 225*d*, among other events, and may have a duration similar to the oxidation 215*b* in the first process path 201.

In the illustrated embodiment, the cleaning chamber loading 225*a* occurs immediately subsequent to the cleaning chamber unloading 210*c*. That is, a start time of the cleaning chamber loading 225*a* may coincide with an end time of the cleaning chamber unloading 210*c*. Thus, a single cleaning chamber may be employed for the first and second process paths 201, 202, such that the wafer processed in the second process path 202 may be loaded into the common cleaning chamber as soon as the wafer processed in the first process path 201 is unloaded from the cleaning chamber. However, in other embodiments, the cleaning chamber loading 225*a* may be delayed beyond the cleaning chamber unloading 210*c*, such that the cleaning delay 225*b* and the cleaning delay 225*c* may be concatenated or combined into a single cleaning delay event. For example, the concatenated cleaning chamber delay may be configured such that cleaning chamber loading 225*a* and the cleaning 225*d* may occur consecutively and the separation between the cleaning 225*d* and the oxidation 230*b* may be minimized. Thus, a start time of the oxidation chamber loading 215*c* may coincide with a start time of the cleaning chamber loading 225*e*, and an end time of the oxidation chamber loading 215*c* may coincide with an end time of the cleaning chamber unloading 225*e* and the oxidation chamber loading 230*a*. Consequently, the second substrate may be transferred from the cleaning chamber to the oxidation chamber as soon as the cleaning 225*d* is completed, thereby minimizing the unintentional formation of oxide on the second substrate and allowing more precise control of the final thickness of the oxide.

As also shown in FIG. 2, the oxidation 215*b* and the oxidation 230*b* may include temperature ramping and de-ramping. Thus, the duration of the oxidation events 215*b*, 230*b* may encompass a temperature ramping period, a dwell time period at the ramped temperature and a temperature de-ramping or cool-down period. Moreover, the oxidation events 215*b*, 230*b* may be substantially similar to the processes performed during the first layer formation period 130 of FIG. 1. The cleaning events 210*b*, 225*d* may also be substantially similar to the processes performed during the cleaning periods 115, 155 of FIG. 1.

Figure 3:
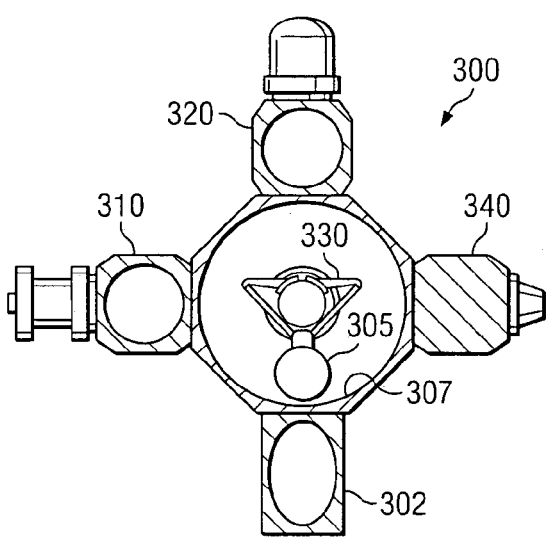
FIG. 3 illustrates a schematic view of one embodiment of a system for manufacturing semiconductor wafers constructed according to aspects of the present disclosure.

Referring to FIG. 3, illustrated is a schematic view of one embodiment of a system 300 for manufacturing semiconductor device gate dielectrics constructed according to aspects of the present disclosure. The system 300 is one environment in which the method 100 of FIG. 1 and/or the method 200 of FIG. 2 may be implemented. The system 300 includes a cleaner 310, a former 320, a transporter 330 and a controller 340. In the illustrated embodiment, the system 300 is a conventional or future-developed cluster tool integrating multiple process chambers or tools. Consequently, the system 300 may also include a load-lock or other loading chamber 302 for transferring wafers or substrates 305 in and out of the system 300. In other embodiments, the system 300 may be a collection of stand-alone process chambers or tools that may be mechanically coupled and/or be in electronic communication.

The cleaner 310 is configured to clean a surface of a substrate 305 within a first time period. For example, the first time period may have a duration of about 30 seconds. In the illustrated embodiment, the cleaner 310 is one of several chambers integrated within a conventional or future-developed cluster tool. For example, the cleaner 310 may be or include the Oasis Clean system described above. However, as discussed above, the cleaner 310 may also be a stand-alone process chamber or tool within the scope of the present disclosure. The cleaner 310 may be configured to process single wafers 305 or a batch of wafers 305. The system 300 may also include multiple cleaners 310.

The former 320 is configured to form a layer over the surface of the substrate 305 within a second time period exceeding the first time period in duration. For example, the second time period may range between about 30 seconds and about 5 minutes. The former 320 may be or include apparatus configured to form the layer by chemical-vapor-deposition, physical-vapor-deposition, atomic layer deposition, plasma-enhanced-deposition, electrochemical plating, ion implantation and/or other conventional or future-developed processes. The former 320 may also be configured to form the layer by RTO or RTNO, and may include apparatus configured to perform in-situ steam generation, rapid thermal processing for annealing and other processes, decoupled plasma nitridation and/or polysilicon generation. In the illustrated embodiment, the former 320 is one of several chambers integrated within a conventional or future-developed cluster tool. For example, the former 320 may be or include the DPM Centura 200 process tool described above. The former 320 may also include multiple process chambers or tools, such that the layer may be collectively formed by processes performed in two or more chambers. The former 320 may be configured to process single wafers 305 or a batch of wafers 305. The system 300 may also include multiple formers 320, such that the system 300 may employ multiple concurrent process paths.

The transporter 330 is configured to transport the substrate 305 between the cleaner 310 and the former 320 within a third time period. For example, the third time period may encompass the transporter 330 unloading the substrate 305 from the cleaner 310, transporting the substrate 305 through a common area 307 of the system 300 and loading the substrate 305 into the former 320. The transporter 330 may be a hand- or robotic-operated member or assembly, possibly having an end effector configured to detachably engage the wafer 305 and/or orient the substrate 305 within a process chamber. The system 300 may also include multiple transporters 330, such that multiple wafers 305 may be transported simultaneously.

The controller 340 is configured to control the cleaner 310, the former 320 and the transporter 330. Thus, although not illustrated as such, the controller 340 may be mechanically coupled to and/or in electrical communication with each of the cleaner 310, the former 320 and the transporter 330, and may comprise multiple controller subassemblies. In one embodiment, the controller 340 includes a processor and memory system for controlling cleaning, delay and/or layer formation methods, such as the method 100 of FIG. 1 and/or the method 200 of FIG. 2.

The controller 340 is configured to delay a start time of the first time period such that a duration of the third time period is less than the second time period. For example, the second time period may have a duration of about 30 seconds or more, as described above, and the third time period may be less than about 30 seconds. Generally, the controller 340 may be configured to delay the start time of the first time period such that the third time period is minimized. In contrast, if the start time of the first time period is not delayed, and the second time period is longer in duration than the first time period, the third time period will include a delay portion in which a cleaned wafer 305 is not being-processed and cannot-be transported to the former 320 because the former 320 is occupied with a previously cleaned wafer 305. As described above, the delay after cleaning can be deleterious to accurate oxide or other layer formation. Thus, in a preferred embodiment, the controller 340 delays the start time of the first time period such that the delay portion of the third time period is minimized or eliminated. For example, the controller 340 may determine an optimized start time delay for the first time period that corresponds to a minimum duration of the third time period. In one embodiment, this minimized third time period includes just enough time to perform unloading the substrate 305 from the cleaner 310, transporting the substrate 305 and loading the substrate 305 into the former 320.

At least a portion of the controller 340 may be integral to or otherwise form at least a portion of the cleaner 310. As such, the cleaner 310 may be configured to determine the optimized start time delay for the first time period such that the minimized third time period is achieved. Thus, the cleaner 310 may include a processor and memory system for controlling cleaning and delay methods, such as the method 100 of FIG. 1 and/or the method 200 of FIG. 2.

Although embodiments of the present disclosure have been described in detail, those skilled in the art should understand that they can make various changes, substitutions and alterations herein without departing from the spirit and scope of the present disclosure.

What is claimed is:

1. A method of manufacturing semiconductor device gate dielectrics, comprising:

cleaning a first substrate surface during a first time period;

forming a first insulating layer over the first substrate surface during a second time period subsequent to the first time period;

cleaning a second substrate surface during a third time period; and forming a second insulating layer over the second substrate surface during a fourth time period subsequent to the second and third time periods, wherein the third time period includes a cleaning delay period prior to a cleaning portion of the third time period, the cleaning delay period configured such that an end time of the third time period substantially coincides with a start time of the fourth time period.

2. The method of claim 1 wherein cleaning the second substrate during the third period includes:

configuring the second substrate surface in a process chamber prior to the cleaning delay period;

exposing the second substrate surface to a cleanser in the process chamber after the delay period; and removing the second substrate surface from the process chamber after exposing the second substrate surface to the cleanser.

3. The method of claim 1 wherein cleaning the second substrate during the third period includes:
configuring the second substrate surface in a process chamber after the cleaning delay period;
exposing the second substrate surface to a cleanser in the process chamber after configuring the second substrate surface in the process chamber; and
removing the second substrate surface from the process chamber after exposing the second substrate surface to the cleanser.

4. The method of claim 1 wherein the first and second substrate surfaces are individually cleaned in a common process chamber.

5. The method of claim 1 wherein the first and second insulating layers are individually formed in a common process chamber.

6. The method of claim 1 wherein the first and second insulating layers each have a thickness ranging between about 10 Angstroms and about 20 Angstroms.

7. The method of claim 1 wherein forming the second insulating layer commences within about 30 seconds of the completion of the second substrate surface cleaning.

8. The method of claim 1 wherein cleaning the first and second substrate surfaces includes exposing the first and second substrate surfaces individually to an AM1 chemistry.

9. The method of claim 1 wherein forming the second insulating layer during the fourth time period includes:
configuring the second substrate surface in a process chamber;
exposing the second substrate surface to an oxidizing environment to form an oxide layer; and
removing the second substrate surface from the process chamber.

10. The method of claim 9 wherein the oxidizing environment is a rapid thermal oxidizing environment comprising NO gas and the second insulating layer is a nitrided oxide layer.

11. The method of claim 10 wherein forming the second insulating layer during the fourth time period further includes exposing the nitrided oxide layer to a decoupled plasma nitridation environment.

12. The method of claim 11 wherein forming the second insulating layer during the fourth time period further includes exposing the nitrided oxide layer to a rapid thermal processing environment to anneal the nitrided oxide layer after the exposure to the decoupled plasma nitridation environment.

13. The method of claim 12 wherein the oxidizing environment is a first oxidizing environment and forming the second insulating layer during the fourth time period further includes exposing the nitrided oxide layer to a second oxidizing environment after the exposure to the rapid thermal processing environment.

14. The method of claim 12 wherein forming the second insulating layer during the fourth time period further includes exposing the nitrided oxide layer to a nitrogen-containing annealing environment.

* * * * *